(12) United States Patent
Dai et al.

(10) Patent No.: US 11,140,352 B1
(45) Date of Patent: Oct. 5, 2021

(54) HIGH DYNAMIC RANGE HIGH SPEED CMOS IMAGE SENSOR DESIGN

(71) Applicant: OMNIVISION TECHNOLOGIES, INC., Santa Clara, CA (US)

(72) Inventors: Tiejun Dai, Santa Clara, CA (US); Zhe Gao, San Jose, CA (US); Ling Fu, Santa Clara, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 17/121,423

(22) Filed: Dec. 14, 2020

(51) Int. Cl.
*H04N 5/378* (2011.01)
*H04N 5/3745* (2011.01)
*H03M 1/34* (2006.01)
*H04N 5/355* (2011.01)

(52) U.S. Cl.
CPC ............ *H04N 5/378* (2013.01); *H03M 1/34* (2013.01); *H04N 5/3559* (2013.01); *H04N 5/35563* (2013.01); *H04N 5/37457* (2013.01)

(58) Field of Classification Search
CPC . H04N 5/35536–35581; H04N 5/3559; H04N 5/37457; H04N 5/378
See application file for complete search history.

(56) References Cited

U.S. PATENT DOCUMENTS

| 10,070,081 | B2 | 9/2018 | Mo et al. | |
|---|---|---|---|---|
| 10,250,828 | B1 | 4/2019 | Xu et al. | |
| 10,694,121 | B2* | 6/2020 | Mori | H04N 5/3741 |
| 2011/0149136 | A1* | 6/2011 | Johnson | H04N 5/3742 |
| | | | | 348/308 |
| 2014/0049291 | A1* | 2/2014 | Soh | H04N 5/378 |
| | | | | 327/94 |
| 2017/0085821 | A1* | 3/2017 | Eshel | H04N 5/378 |
| 2018/0184026 | A1* | 6/2018 | Kato | H04N 5/363 |
| 2018/0234649 | A1* | 8/2018 | Matsuura | H04N 5/3575 |
| 2019/0222782 | A1* | 7/2019 | Kobayashi | G01T 1/24 |
| 2020/0260034 | A1* | 8/2020 | Moue | H01L 27/14609 |

FOREIGN PATENT DOCUMENTS

EP    3605606 A1    2/2020

OTHER PUBLICATIONS

Dai et al., U.S. Appl. No. 16/886,473, filed May 28, 2020, 41 pages.

* cited by examiner

*Primary Examiner* — Paul M Berardesca
(74) *Attorney, Agent, or Firm* — Christensen O'Connor Johnson Kindness PLLC

(57) ABSTRACT

A readout circuit for use in an image sensor includes a first sample and hold (SH) circuit coupled to a bitline that is coupled to a pixel array. A second SH circuit is coupled to the bitline. A bypass switch is coupled to the bitline, the first SH circuit, and the second SH circuit. An analog to digital converter (ADC) is coupled to the bypass switch. The bypass switch is configured to provide an image charge value from the pixel array to the ADC through the bitline, or through one of the first SH circuit or the second SH circuit in response to a switch select signal.

28 Claims, 7 Drawing Sheets

HIGH DYNAMIC RANGE HIGH SPEED CMOS IMAGE SENSOR DESIGN

BACKGROUND INFORMATION

Field of the Disclosure

This disclosure relates generally to image sensors, and in particular but not exclusively, relates to high dynamic range (HDR) complementary metal oxide semiconductor (CMOS) image sensors.

Background

Image sensors have become ubiquitous and are now widely used in digital cameras, cellular phones, security cameras, as well as, medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog signals from the column bitlines and converted to digital values to produce digital images (i.e., image data) representing the external scene.

Standard image sensors have a limited dynamic range of approximately 60 to 70 dB. However, the luminance dynamic range of the real world is much larger. For instance, natural scenes often span a range of 90 dB and greater. In order to capture details in bright highlights and dim shadows simultaneously, high dynamic range (HDR) technologies have been used in image sensors to increase the captured dynamic range. One common technique to increase dynamic range is to merge multiple exposures captured with different exposure settings using standard (low dynamic range) image sensors into a single linear HDR image, which results in a much larger dynamic range image than a single exposure image.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
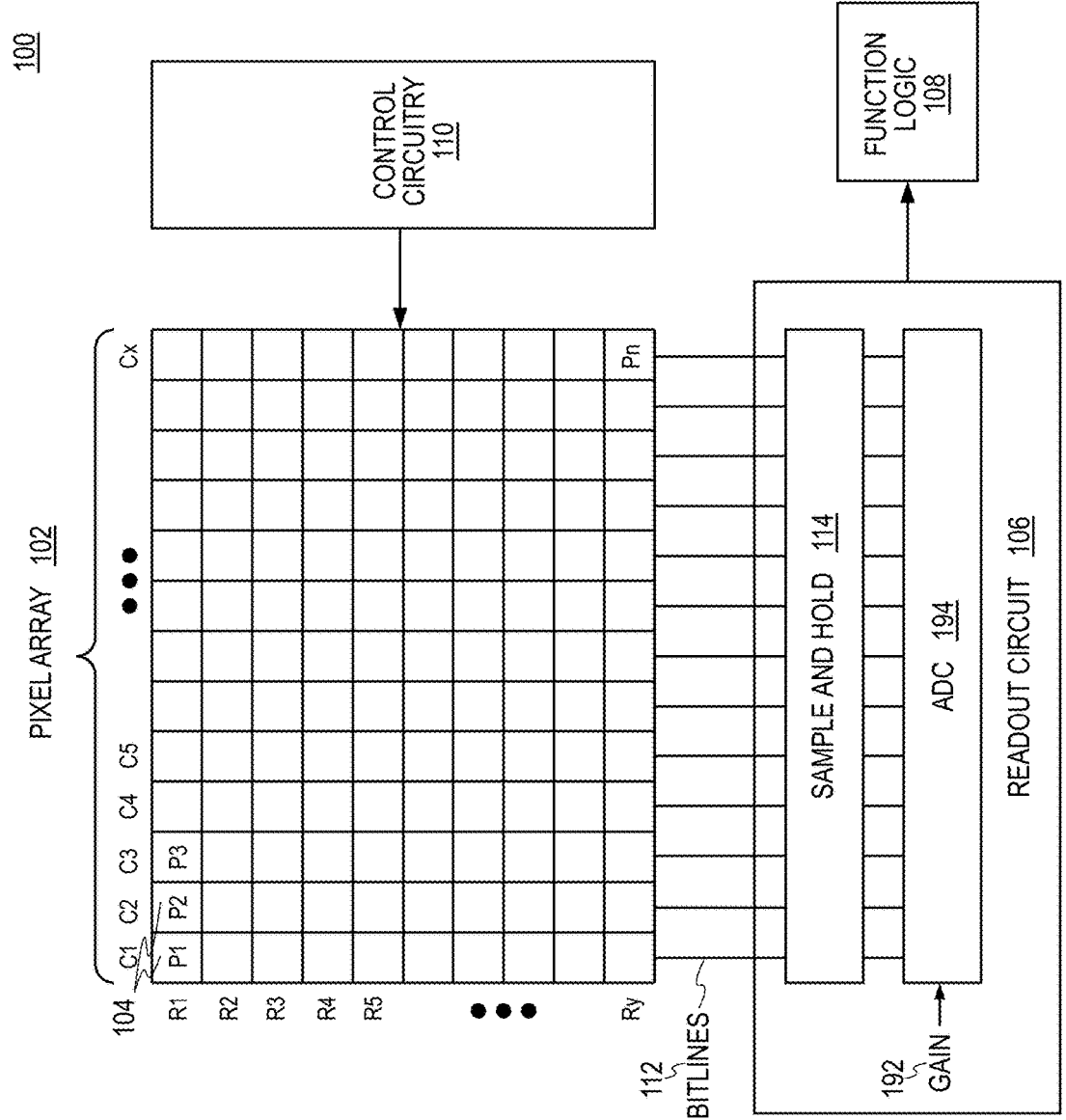
FIG. 1 illustrates one example of an imaging system including a pixel array with a high dynamic range shared pixel CMOS image sensor with a readout circuit that provides a high speed readout in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system including a pixel array with a high dynamic range (HDR) shared pixel CMOS image sensor and a readout circuit that includes sample and hold circuitry enabling parallel operations providing high speed readout of the image sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including a pixel array with an HDR shared pixel CMOS image sensor and a readout circuit that includes sample and hold circuitry enabling parallel operations that provide high speed readout are described. In various examples, the sample and hold circuitry included in the readout circuit also includes a bypass that enables continuous readouts of image charge values from the pixel array by the analog to digital conversion circuitry. In addition, the sample and hold circuitry includes multiple sample and hold circuits that enable analog to digital conversions to be performed on a first image charge value from a first readout that is stored in a first sample and hold circuit while a second image charge value from a second readout is being sampled and held in a second sample and hold circuit in a parallel operation. With these parallel analog to digital conversions with sample and hold operations, readout times from the pixel array are reduced and improved in accordance with the teachings of the present invention. In various examples, the pixel array from which the image charge values are read out includes HDR shared pixel cell structures that include a plurality of subpixels that include a first subpixel configured as a small photodiode (SPD) to sense light in medium to higher intensity lighting conditions, a plurality of second subpixels that are configured as a large photodiode (LPD) to sense light in dimmer or medium intensity lighting conditions, as well as a lateral overflow integration capacitor (LOFIC) design to sense light in bright light conditions to realize HDR imaging in accordance with the teachings of the present invention.

To illustrate, FIG. 1 shows one example of an imaging system 100 that includes a pixel array with an HDR shared pixel CMOS image sensor and a readout circuit in accordance with the teachings of the present invention. In the example, the imaging system 100 includes a pixel array 102, control circuitry 110, readout circuit 106, and function logic 108. In one example, pixel array 102 is a two-dimensional (2D) array including a plurality of pixel cells 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

As will be discussed in greater detail below, in one example, each pixel cell 104 is configured as a shared pixel HDR pixel cell with a plurality of subpixels including a first subpixel configured as a small photodiode (SPD) and a plurality of second subpixels configured as a large photodiode (LPD) to photogenerate image charge in response to incident light. In the example, a lateral overflow integration capacitor (LOFIC) with low leakage is also included, which further expands the dynamic range of the pixel cell. In addition, light attenuating filters, which may also be referred to as neutral density (ND) filters or ND optical attenuators are also included. In one example, ND filters having an attenuation ratio of 5:1 (i.e., 5×), or in the range of 5:1 to 10:1 (i.e., 5-10×) may be utilized in the pixel cells 104 to provide good mid-range image sensor performance with a signal to noise ratio (SNR)>25 dB.

After each pixel cell 104 has acquired its image charge, the corresponding analog image charge values are read out by readout circuit 106 through column bitlines 112 by readout circuit 106. In the various examples, the analog image charge signals are converted to digital values with an analog to digital converter (ADC) 194 included in the readout circuit 106. In one example, the ADC 194 has adjustable gain 192, which enables the image charge values to be read out from the pixel array 102 with different gain settings in accordance with teachings of the present invention. The digital representations of the image charge values may then be transferred to function logic 106. In various examples, readout circuit 106 may also include amplification circuitry, or otherwise. Function logic 108 may simply store the image charge values or even manipulate the image data by applying post image effects (e.g., crop, rotate, remove red eye, adjust brightness, adjust contrast, or otherwise). In one example, readout circuit 106 may read out one row of image charge values at a time along column bitlines 112 (illustrated) or may read out the image charge values using a variety of other techniques (not illustrated), such as a serial read out or a full parallel readout of all pixel cells 104 simultaneously.

In one example, control circuitry 110 is coupled to pixel array 102 to control operational characteristics of pixel array 102. For instance, in one example, control circuitry 110 generates the transfer gate signals and other control signals to control the transfer and readout of image data from all of the subpixels of each shared pixel cell 104 of pixel array 102. In addition, control circuitry 110 may generate a shutter signal for controlling image acquisition. In one example, the shutter signal is a global shutter signal for simultaneously enabling all pixel cells 104 within pixel array 102 to simultaneously capture their respective image charge values during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

Figure 2A:
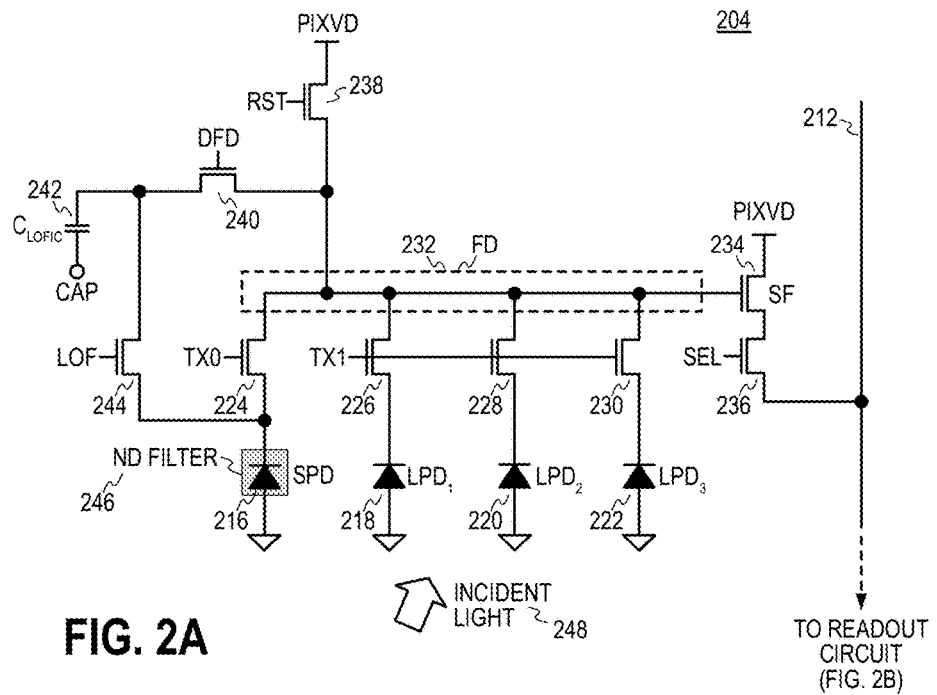
FIG. 2A illustrates one example schematic of a shared pixel cell of a high dynamic range CMOS image sensor in accordance with the teachings of the present disclosure.

FIG. 2A illustrates one example schematic of an example shared pixel cell 204 of a pixel array of an HDR CMOS image sensor with low color crosstalk in accordance with the teachings of the present disclosure. It is appreciated the example schematic of pixel cell 204 of FIG. 2A may be one example of one of the pixel cells 104 of the pixel array 102 as shown in FIG. 1, and that similarly named and numbered elements described above are coupled and function similarly below.

As shown in the depicted example, shared pixel cell 204 includes a plurality of subpixels, each of which includes a photodiode coupled to photogenerate image charge in response to incident light 248. In the example, the plurality of subpixels include a first subpixel, which is configured as a small photodiode (SPD) 216, and a plurality of second subpixels, which are configured as a large photodiode (LPD) including photodiodes $LPD_1$ 218, $LPD_2$ 220, and $LPD_3$ 222 as shown. In the depicted example, pixel cell 204 also includes a floating diffusion FD 232 coupled to receive the image charge from the plurality of subpixels SPD 216, $LPD_1$ 218, $LPD_2$ 220, and $LPD_3$ 222.

The example depicted in FIG. 2A also shows a plurality of transfer transistors including a first transfer transistor 224, and a plurality of second transistors, which include transfer transistor 226, transfer transistor 228, and transfer transistor 230. In operation, the photogenerated image charge is coupled to be transferred from the first subpixel SPD 216 to the floating diffusion FD 232 through the first transfer transistor 224. The photogenerated image charge is coupled to be transferred from the plurality of second subpixels $LPD_1$ 218, $LPD_2$ 220, and $LPD_3$ 222 to the floating diffusion FD 232 through the plurality of second transfer transistors 226, 228, and 230, respectively. In the example depicted in FIG. 2A, transfer transistor 224 is coupled to be controlled in response to transfer control signal TX0, and transfer transistors 226, 228, and 230 are coupled to be controlled in response to transfer control signal TX1 as shown.

In one example, pixel cell 204 also includes an attenuation layer 246 disposed over the first subpixel SPD 216. In one example, attenuation layer 246 is a neutral density (ND) filter. In one example, the attenuation layer 246 has an attenuation ratio of 5:1 (i.e., 5×), or in the range of 5:1 to 10:1 (i.e., 5-10×). In operation, the first subpixel SPD 216 is optically coupled to receive the incident light 248 through the attenuation layer 246. In the example, the plurality of second subpixels $LPD_1$ 218, $LPD_2$ 220, and $LPD_3$ 222 are not covered by attenuation layer 246 and are therefore optically coupled to receive the incident light 248 without passing through the attenuation layer 246.

In the example illustrated in FIG. 2A, a dual floating diffusion (DFD) transistor 240 is coupled to the floating diffusion FD 232, and a capacitor $C_{LOFIC}$ 242 is coupled to the DFD transistor 240 as shown. In one example, the capacitor $C_{LOFIC}$ 242 is a lateral overflow integration capacitor (LOFIC), which is coupled to receive a CAP signal as shown. In one example, the capacitor $C_{LOFIC}$ 242 is a high density capacitor that utilizes for instance a three dimensional metal-insulator-metal (MIM) design, which provides a large LOFIC. For instance, in one example, the capacitor $C_{LOFIC}$ 242 has a capacitance of 64 fF. In one example, a LOFIC transistor 244 is coupled between the capacitor $C_{LOFIC}$ 242 and the first subpixel SPD 216 as shown. In the example, the LOFIC transistor 244 is coupled to be controlled in response to an LOF signal.

The illustrated example shows that pixel cell 204 also includes a source follower transistor 234 coupled to a supply voltage PIXVD and includes a gate that is coupled to the floating diffusion FD 232. A row select transistor 236 is coupled to the source follower transistor 234 and a column bitline 212, and is coupled to be controlled in response to a select signal SEL. In operation, the source follower transistor 234 is coupled to output an image charge value to the bitline 212 through select transistor 236 in response to the image charge in the floating diffusion FD 232. As shown will be shown in greater detail below in FIG. 2B, a readout circuit is coupled to bitline 212 to read out the image charge value from bitline 212. A reset transistor 238 is coupled between the supply voltage PIXVD and the floating diffusion FD 232 and is coupled to reset the pixel cell 204 in response to a reset control signal RST. In operation, reset transistor 238 may be configured to reset the floating diffusion FD 232, as well as reset the capacitor $C_{LOFIC}$ 242 through the DFD transistor 240.

Figure 2B:
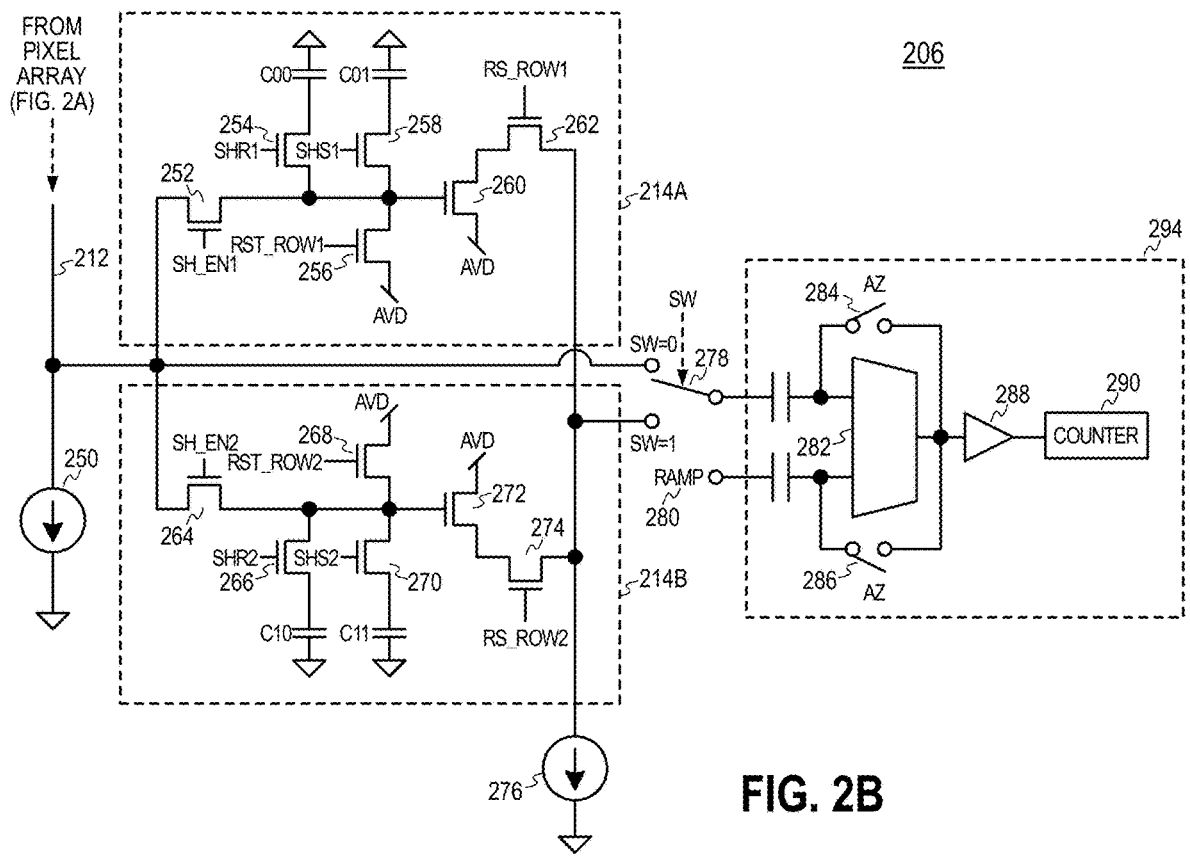
FIG. 2B illustrates one example schematic of a portion of a readout circuit including sample and hold circuitry coupled to an analog to digital conversion circuit that provide a high speed readout of a high dynamic range CMOS image sensor in accordance with the teachings of the present disclosure.

FIG. 2B illustrates one example schematic of a portion of a readout circuit 206 for use in an image sensor that includes sample and hold circuitry coupled to an analog to digital conversion circuit to provide a high speed readout of a high dynamic range CMOS image sensor in accordance with the teachings of the present disclosure. It is appreciated the example portion of readout circuit 206 of FIG. 2B may be one example of readout circuit 106 of as shown in FIG. 1, and that similarly named and numbered elements described above are coupled and function similarly below.

As shown in the example depicted in FIG. 2B, readout circuit 206 includes a first sample and hold (SH) circuit 214A coupled to a bitline 212, which is coupled to a pixel array. In particular, it is appreciated that readout circuit 206 is coupled to bitline 212 to read out image charge values from a pixel cell of a pixel array, such as pixel cell 204 as described for example in FIG. 2A above. Referring back to the example depicted in FIG. 2B, readout circuit 206 include also includes a second SH circuit 214B, which is coupled to the bitline 212. A bypass switch 278 is coupled to the bitline 212 as well as the first SH circuit 214A and the second SH circuit 214B. An analog to digital converter (ADC) 294 coupled to the bypass switch 278.

As will be discussed, the bypass switch 278 is configured to provide an image charge value from the pixel array to the ADC 294 directly through the bitline 212, or through one of the first SH circuit 214A or the second SH circuit 214B in response to a switch select signal SW. As shown in the illustrated example, the first SH circuit 214A and the second SH circuit 214B are substantially similar to one another.

In particular, the example depicted in FIG. 2B shows that first SH circuit 214A includes an enable transistor 252 coupled to the bitline 212. A first storage transistor 254 is coupled to the enable transistor 252. In the example, the enable transistor 252 is responsive to a first sample and hold enable signal SH_EN1. A first storage device C00 is coupled to the first storage transistor 254. In the example, the first storage device C00 of first SH circuit 214A is a capacitor. In one example, first SH circuit 214A also includes a second storage transistor 258 that is coupled to the enable transistor 252, and a second storage device C01 is coupled to the second storage transistor 258. In one example, the second storage device C01 is a capacitor. A reset transistor 256 is coupled between a supply voltage AVD and the first storage transistor 254 and the second storage transistor 258. The reset transistor 256 is responsive to a first reset row signal RST_ROW1. In the depicted example, a source follower transistor 260 having a gate is coupled to the first storage transistor 254 and the second storage transistor 258. A select transistor 262 is coupled between the source follower transistor 262 and the bypass switch 278. The select transistor 262 is responsive to a first row select row signal RS_ROW1.

Similarly, second SH circuit 214B also includes an enable transistor 264 coupled to the bitline 212. A first storage transistor 266 is coupled to the enable transistor 264. In the example, the enable transistor 264 is responsive to a second sample and hold enable signal SH_EN2. A first storage device C10 of second SH circuit 214B is coupled to the first storage transistor 266. In the example, the first storage device C10 is a capacitor. In one example, second SH circuit 214B also includes a second storage transistor 270 that is coupled to the enable transistor 264, and a second storage device C11 of second SH circuit 214B is coupled to the second storage transistor 270. In one example, the second storage device C01 is a capacitor. A reset transistor 268 is coupled between the supply voltage AVD and the first storage transistor 266 and the second storage transistor 270. The reset transistor is responsive to a second reset row signal RST_ROW2. In the depicted example, a source follower transistor 270 having a gate is coupled to the first storage transistor 266 and the second storage transistor 270. A select transistor 274 is coupled between the source follower transistor 272 and the bypass switch 278. The select transistor 274 is responsive to a second row select row signal RS_ROW2.

The example readout circuit 206 illustrated in FIG. 2B also illustrates a bitline current source 250 coupled to bitline 212, and a sample and hold current source 276 coupled to select transistor 262, select transistor 274, and bypass switch 278 as shown.

Continuing with the example depicted in FIG. 2B, ADC 294 includes a comparator 282 having a first input that is capacitively coupled to bypass switch 278 to receive an image charge value from the pixel array through the bitline 212, or from one of the first SH circuit 214A or second SH circuit 214B in response to the switch select signal SW. Comparator 282 also includes a second input that is capacitively coupled to receive a ramp signal 280 from a ramp generator. In the depicted example, a counter 290 is coupled to an output of the comparator 282. In the depicted example, ADC 294 also includes a buffer 288 that is coupled between the output of the comparator 282 and the counter 290. A first auto-zero switch 284 is coupled between the first input of the comparator 282 and the output of the comparator 282. A second auto-zero switch 285 coupled between the second input of the comparator 282 and the output of the comparator 282.

In one example during operation, the switch select signal SW is configured to equal a first logic level (e.g., SW=0 or logic low) during a bypass period. During the bypass period, the bypass switch 278 is configured to couple the ADC 294 directly to the bitline 212. In the example, the switch select signal SW is configured to equal a second logic level (e.g., SW=1 or logic high) during a non-bypass period. During the non-bypass period, the bypass switch 278 is configured to couple the ADC 294 to the select transistor 262 of first SH circuit 214A and the select transistor 274 of second SH circuit 214B.

FIGS. 3A-3D illustrate example timing diagrams of signals found in an example shared pixel cell of a CMOS image sensor during a high speed readout in accordance with the teachings of the present disclosure. It is appreciated that the signals illustrate in FIGS. 3A-3D may be examples of the signals found the example pixel cell 204 of FIG. 2A and/or the example readout circuit 206 of FIG. 2B above, and that similarly named and numbered elements described above are coupled and function similarly below.

For instance, each illustrated timing diagram in FIGS. 3A-3D shows a reset signal RST 338, a select signal SEL 336, a transfer transistor signal TX0 324, a transfer transistor signal TX1, 326, a dual floating diffusion signal DFD 340, a LOFIC signal LOF 344, a switch select signal SW 378, an analog to digital operation AD 316, a first sample and hold enable signal SH_EN1 352, a first sample and hold reset signal SHR1 354, a first sample and hold signal SHS1 358, a first reset row signal RST_ROW1 356, a first row select row signal RS_ROW1 362, a second sample and hold enable signal SH_EN2 364, a second sample and hold reset signal SHR2 366, a second sample and hold signal SHS2 370, a second reset row signal RST_ROW2 368, and a second row select row signal RS_ROW2 374.

As will be described in the example readouts depicted in FIGS. 3A-3D, correlated double sampling (CDS) is performed in the readouts of the large photodiode (LPD), the small photodiode (SPD), and the lateral overflow integration capacitor (LOFIC). As such, a reset image charge value as well as a signal image charge value will be read out from the LPD, the SPD, and the LOFIC. Normalized image charge values can be determined in response to the differences between the signal image charge values and the reset image charge values. In addition, for improved dynamic range, the analog to digital (AD) conversion operations performed on the readouts of the LPD are performed at a first gain setting and a second gain setting. As a result, a total of total of eight AD operations are performed on the image charge values that are read out from the LPD, the SPD, and the LOFIC, as will be indicated with the eight AD operations occurring in the AD 316 timelines in FIGS. 3A-3D.

Figure 3A:
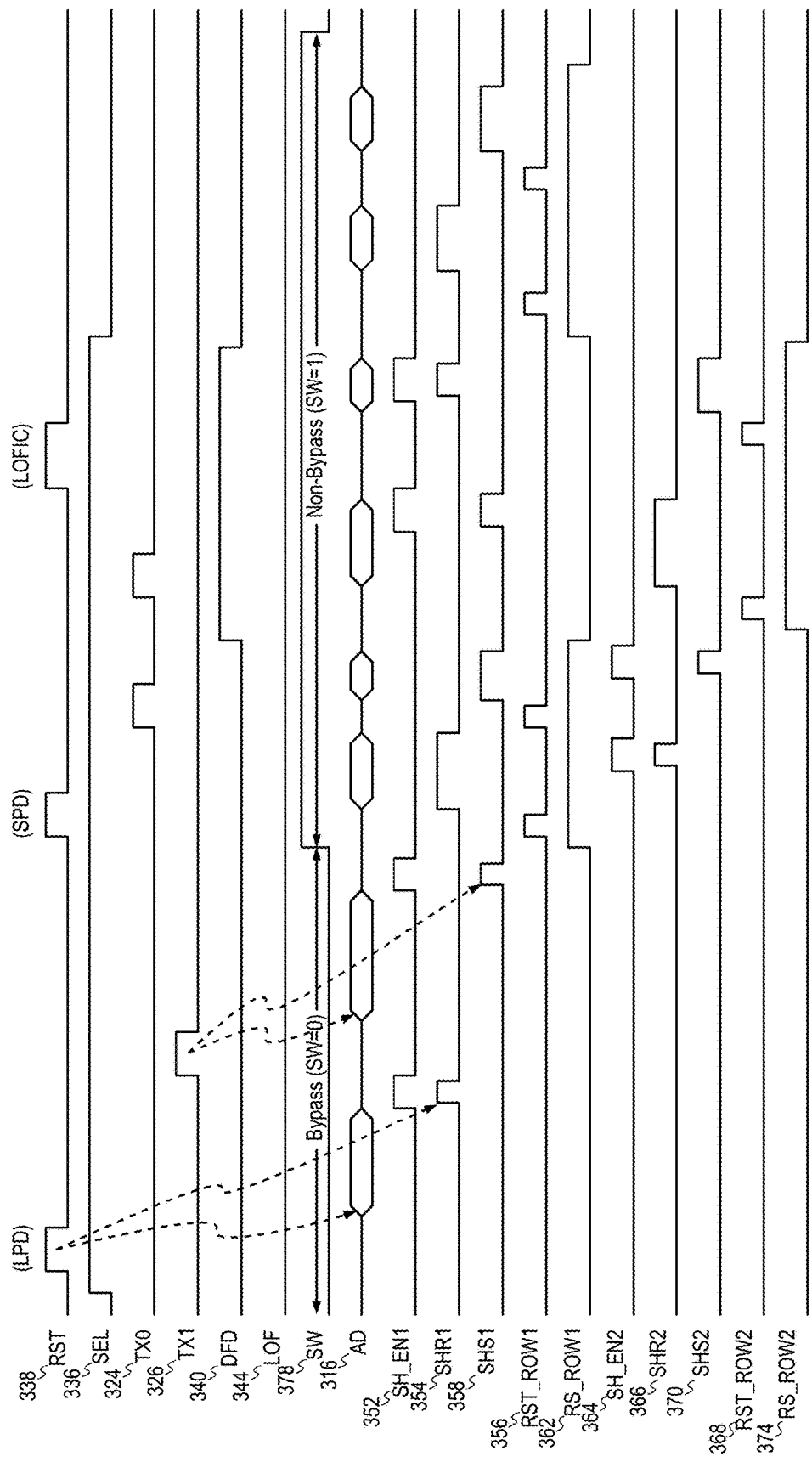
FIG. 3A illustrates an example timing diagram of signals found in an example shared pixel cell of a CMOS image sensor during a high speed readout in accordance with the teachings of the present disclosure.

Beginning specifically with the example depicted in FIG. 3A, the switch select signal SW 378 is initially set to a low value (e.g., SW=0), which couples the select switch 278 directly to the bitline 212 during the bypass period. The select signal 336 then transitions to a high value, which turns on the select transistor 236 coupling the pixel cell 204 to the bitline 212 and enabling the LPD, SPD, and LOFIC to be read out from the pixel cell 204.

Next the reset signal RST 338 is pulsed, which pulses the reset transistor 238 and resets the pixel cell 204. While the bypass switch 278 in the SW=0 setting, the input of the comparator 282 is continuously coupled to the bitline 212, and therefore performs a first AD operation on the reset image charge value from the pixel cell 204 through the bitline 212, which is indicated in FIG. 3A with the first dashed line from the first pulse of reset signal RST 338 to the first AD operation in AD 316. In the depicted example, the first AD operation indicated in AD 316 is performed on the reset image charge value for the LPD at a first gain setting, which may be set for example with gain 192 as illustrated for example in FIG. 1.

Once the first AD operation indicated in AD 316 is performed for the reset image charge value of the LPD at the first gain setting, the first sample and hold enable signal SH_EN1 352 and the first sample and hold reset signal SHR1 354 are pulsed, which pulse the transistors 252 and 254 in the first SH circuit 214A, and therefore sample and hold the reset image charge value of the LPD into storage device COO, which is indicated in FIG. 3A with the second dashed line from the first pulse of reset signal RST 338 to the first pulse of the first sample and hold reset signal SHR1 354.

Next, the transistor signal TX1 326 is pulsed, which pulses the transfer transistors 226, 228, and 230 in pixel cell 204, which transfers the image charge from the LPD, which includes photodiodes 218, 220, and 222, to the floating diffusion FD 232. While the bypass switch 278 is still in the SW=0 setting, the input of the comparator 282 is still continuously coupled to the bitline 212, and therefore performs a second AD operation on the signal image charge value from the pixel cell 204 through the bitline 212, which is indicated in FIG. 3A with the first dashed line from the pulse of the first transistor signal TX1 326 to the second AD operation in AD 316. In the depicted example, the second AD operation indicated in AD 316 is performed on the signal image charge value for the LPD at the first gain setting, which may be set for example with gain 192 as illustrated for example in FIG. 1.

Once the second AD operation indicated in AD 316 is performed for the signal image charge value of the LPD at the first gain setting, the first sample and hold enable signal SH_EN1 352 and the first sample and hold signal SHS1 358 are pulsed, which pulse the transistors 252 and 258 in the first SH circuit 214A, and therefore sample and hold the signal image charge value of the LPD into storage device COL which is indicated in FIG. 3A with the second dashed line from the pulse of the first transistor signal TX1 326 to the first pulse of the first sample and hold signal SHS1 358.

Figure 3B:
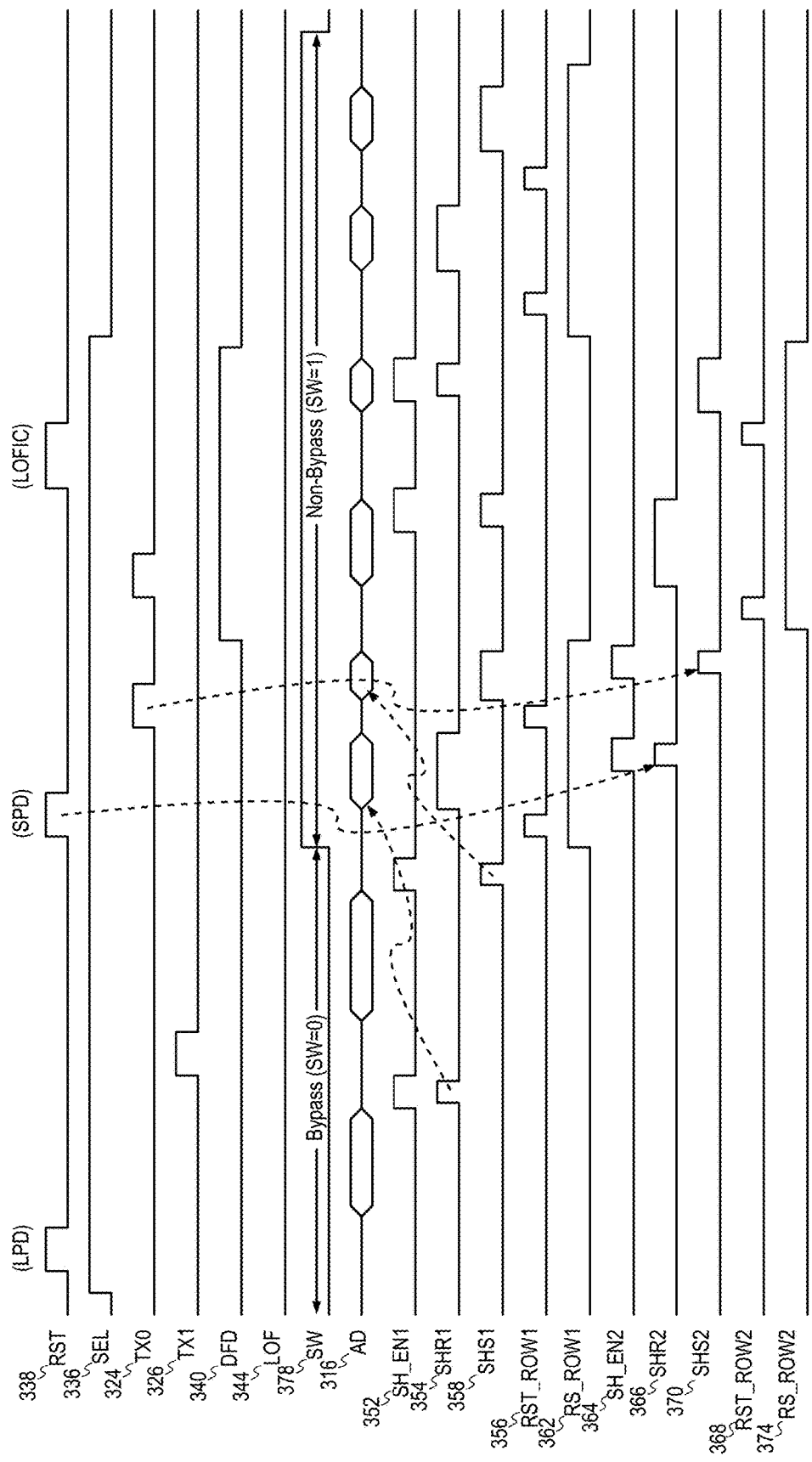
FIG. 3B illustrates another example timing diagram of signals found in an example shared pixel cell of a CMOS image sensor during a high speed readout in accordance with the teachings of the present disclosure.

Continuing the example in FIG. 3B, the switch select signal SW 378 transitions from the low value to a high value (e.g., SW=1), which couples the select switch 278 to the first SH circuit 214A and to the second SH circuit 214B to begin the non-bypass period. The reset signal RST 338 is then pulsed a second time, which pulses the reset transistor 238 and resets the pixel cell 204.

At this time, the second sample and hold enable signal SH_EN2 364 and the second sample and hold reset signal SHR2 366 are pulsed, which pulse the transistors 264 and 266 in the second SH circuit 214B, and therefore sample and hold the reset image charge value of the SPD into storage device C10 from the bitline 212, which is indicated in FIG. 3B with the dashed line from the second pulse of the reset signal RST 338 to the first pulse of the second sample and hold reset signal SHR2 366.

During this time, with the bypass switch 278 in the SW=1 setting, the comparator 218 is no longer continuously coupled to the bitline 212. Instead, the comparator 218 is coupled to the first SH circuit 214A and to the second SH circuit 214B. At this time, the first row select row signal RS_ROW1 362 is transitions to a high value and the second row select row signal RS_ROW2 374 remains at a low value, which turns on transistor 262 of first SH 214A and keeps the transistor 274 of second SH 214B turned off. In addition the first reset row signal RST_ROW1 356 is pulsed, which resets the first SH circuit 214A, and then the first sample and hold reset signal SHR1 354 is turned on, which couples the reset image charge value of the LPD previously stored in storage device COO to comparator 218.

Thus, the comparator 218 is coupled to perform a third AD operation on the previously stored reset image charge value of the LPD stored in storage device COO, as indicated with the dashed line from the first pulse of the first sample and hold reset signal SHR1 354 to the third AD operation in AD 316. In the depicted example, the third AD operation indicated in AD 316 is performed on the reset image charge value of the LPD at a second gain setting, which may be set for example with gain 192 as illustrated for example in FIG. 1.

As can be appreciated in FIG. 3B, the third AD operation indicated in AD 316 is performed on the reset image charge value of the LPD stored in first SH circuit 214A at the same time as, during, or in parallel with the sample and hold operation of the reset image charge value of the SPD into the second SH circuit 214B. This parallel sample and hold and AD operation enables high speed readouts in accordance with the teachings of the present invention.

Referring now to the example depicted in FIG. 3B, after the third AD operation indicated in AD 316 on the previously stored reset image charge value of the LPD stored in storage device COO is complete, the first sample and hold reset signal SHR1 354 transitions to low, the first reset row signal RST_ROW1 356 is pulsed, and the first sample and hold signal signal SHS1 358 transitions to high, which turns off transistor 254, resets the first SH circuit 214A, and turns on transistor 258, which couples the signal image charge value of the LPD previously stored in storage device C01 to comparator 282.

Thus, the comparator 218 is coupled to perform a fourth AD operation on the previously stored signal image charge value of the LPD stored in storage device COL as indicated with the dashed line from the first pulse of the first sample and hold signal SHS1 358 to the fourth AD operation in AD 316. In the depicted example, the fourth AD operation indicated in AD 316 is performed on the signal image charge value of the LPD at the second gain setting, which may be set for example with gain 192 as illustrated for example in FIG. 1.

At this time, after the reset image charge value of the SPD has been sampled and held into storage device C10 from the bitline 212, the transfer transistor signal TX0 324 is pulsed, which pulses transfer transistor 224, which transfers the image charge from the SPD, which includes photodiode 216, to the floating diffusion FD 232. At this time, the second sample and hold enable signal SH_EN2 364 and the second sample and hold signal SHS2 370 are also pulsed, which pulse the transistors 264 and 270 in the second SH circuit 214B. As a result, the signal image charge value of the SPD is sampled and held into storage device C11 from the bitline 212, as indicated with the dashed line from the first pulse of the transistor signal TX0 324 to the first pulse of the second sample and hold signal SHS2 370.

As can be appreciated, the fourth AD operation in AD 316 is performed on the signal image charge value of the LPD stored in first SH circuit 214A at the same time as, during, or in parallel with the sample and hold operation of the signal image charge value of the SPD into the second SH circuit 214B. This parallel sample and hold and AD operation enables high speed readouts in accordance with the teachings of the present invention.

Figure 3C:
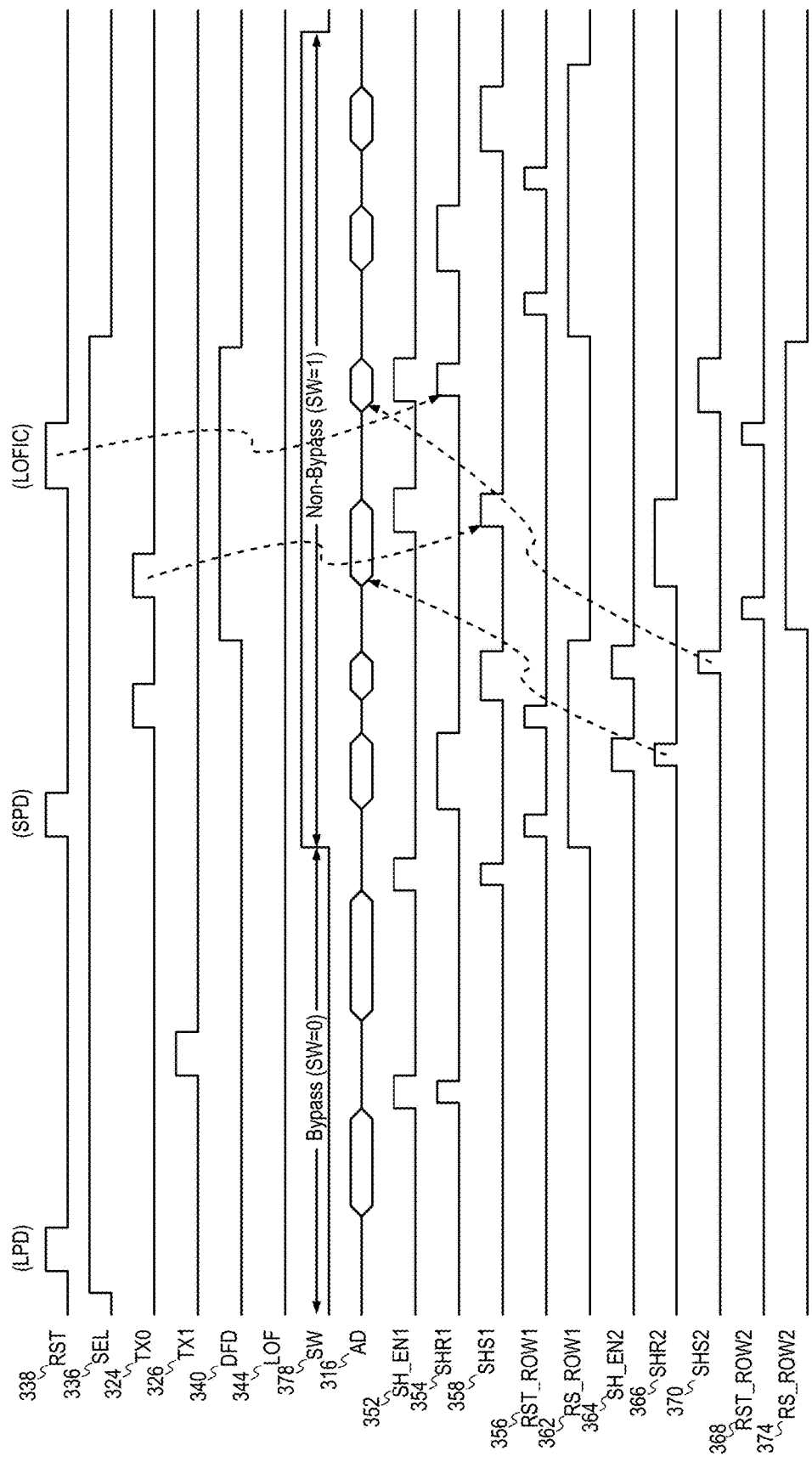
FIG. 3C illustrates yet another example timing diagram of signals found in an example shared pixel cell of a CMOS image sensor during a high speed readout in accordance with the teachings of the present disclosure.

Referring now to the example in FIG. 3C, the dual floating diffusion signal DFD 340 transitions to high, which turns on transistor 240 and couples the LOFIC capacitor $C_{LOFIC}$ 242 to the floating diffusion FD 232. The transfer transistor signal TX0 324 is then pulsed, which also transfers image charge from the photodiode 216 to the floating diffusion FD 232. The first sample and hold enable signal SH_EN1 352 and the first sample and hold signal SHS1 358 are pulsed, which pulse the transistors 252 and 258 in the first SH circuit 214A, and therefore sample and hold the signal image charge value of the LOFIC into storage device COL which is indicated in FIG. 3C with the dashed line from the second pulse of the transfer transistor TX0 324 to the third pulse of the first sample and hold signal SHS1 358.

At this time, the first row select row signal RS_ROW1 362 is transitions to a low value and the second row select row signal RS_ROW2 374 transitions to a high value, which turns off transistor 262 of first SH 214A and turns on the transistor 274 of second SH 214B. Thus, the comparator 282 is coupled to perform an AD operation on the image charge values stored in the second SH circuit 214B.

As such, the second reset row signal RST_ROW2 368 is pulsed, which resets the second SH circuit 214B, and then the second sample and hold reset signal SHR2 366 is turned on, which couples the reset image charge value of the SPD previously stored in storage device C10 to comparator 218.

Thus, the comparator 218 is coupled to perform a fifth AD operation on the previously stored reset image charge value of the SPD stored in storage device C10, as indicated with the dashed line from the first pulse of the second sample and hold reset signal SHR2 366 to the fifth AD operation in AD 316.

As can be appreciated in FIG. 3C, the fifth AD operation indicated in AD 316 is performed on the reset image charge value of the SPD stored in second SH circuit 214B at the same time as, during, or in parallel with the sample and hold operation of the signal image charge value of the LOFIC into the first SH circuit 214A. This parallel sample and hold and AD operation enables high speed readouts in accordance with the teachings of the present invention.

Continuing with the example depicted in FIG. 3C, after the fifth AD operation indicated in AD 316 on the previously stored reset image charge value of the SPD stored in storage device C10 is complete, the second sample and hold reset signal SHR2 366 transitions to low, the second reset row signal RST_ROW2 368 is pulsed, and the second sample and hold signal SHS2 370 transitions to high, which turns off transistor 266, resets the second SH circuit 214B, and turns on transistor 270, which couples the signal image charge value of the SPD previously stored in storage device C11 to comparator 218.

Thus, the comparator 218 is coupled to perform a sixth AD operation on the previously stored signal image charge value of the SPD stored in storage device C11, as indicated with the dashed line from the first pulse of the second sample and hold signal SHS2 370 to the sixth AD operation in AD 316.

At this time, after the signal image charge value of the LOFIC has been sampled and held into storage device C01 from the bitline 212, the reset signal RST 338 is pulsed, which pulses reset transistor 238 and resets the pixel cell 204. At this time, the first sample and hold enable signal SH_EN1 352 and the first sample and hold reset signal SHR1 354 are pulsed, which pulse the transistors 252 and 254 in the first SH circuit 214A, and therefore sample and hold the reset image charge value of the LOFIC into storage device COO from the bitline 212, which is indicated in FIG. 3C with the dashed line from the third pulse of the reset signal RST 338 to the third pulse of the first sample and hold reset signal SHR1 354.

As can be appreciated, the sixth AD operation in AD 316 is performed on the signal image charge value of the SPD stored in second SH circuit 214B at the same time as, during, or in parallel with the sample and hold operation of the reset image charge value of the LOFIC into the first SH circuit 214A. This parallel sample and hold and AD operation enables high speed readouts in accordance with the teachings of the present invention.

Figure 3D:
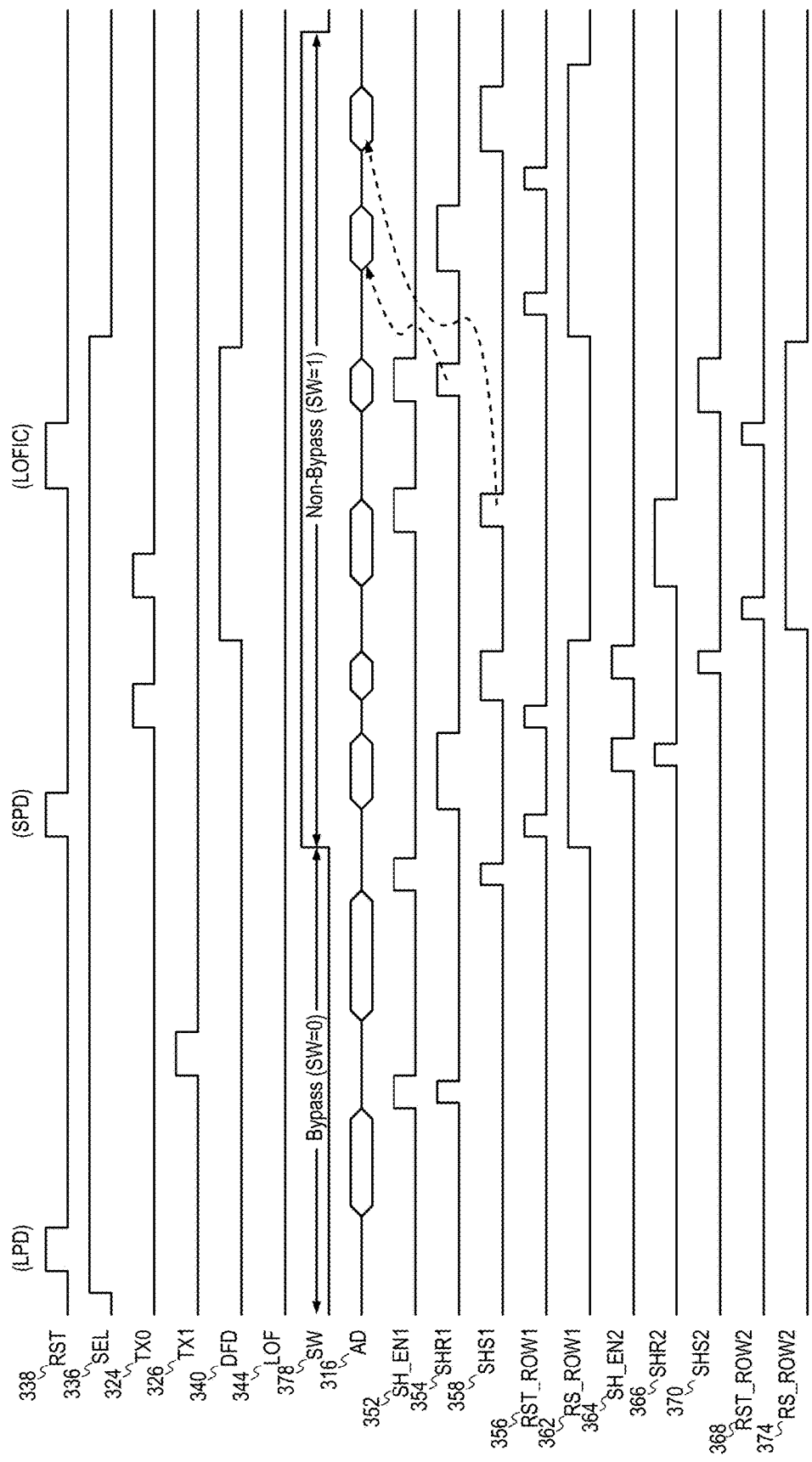
FIG. 3D illustrates still another example timing diagram of signals found in an example shared pixel cell of a CMOS image sensor during a high speed readout in accordance with the teachings of the present disclosure.

Referring now to the example in FIG. 3D, the first row select row signal RS_ROW1 362 is transitions to a high value and the second row select row signal RS_ROW2 374 transitions to a low value, which turns on transistor 262 of first SH 214A and turns off the transistor 274 of second SH 214B. In addition the first reset row signal RST_ROW1 356 is pulsed, which resets the first SH circuit 214A, and then the first sample and hold reset signal SHR1 354 is turned on, which couples the reset image charge value of the LOFIC previously stored in storage device COO to comparator 218.

Thus, the comparator 218 is coupled to perform a seventh AD operation on the previously stored reset image charge value of the LOFIC stored in storage device COO, as indicated with the dashed line from the third pulse of the first sample and hold reset signal SHR1 354 to the seventh AD operation in AD 316.

Next, after the seventh AD operation in AD 316 is complete, the first sample and hold reset signal SHR1 354 is turned off and then the first reset row signal RST_ROW1 356 is pulsed, which resets the first SH circuit 214A. Next, the first sample and hold signal SHS1 358 is turned on, which couples the signal image charge value of the LOFIC previously stored in storage device C01 to comparator 218.

Thus, the comparator 218 is coupled to perform an eighth AD operation on the previously stored signal image charge value of the LOFIC stored in storage device C01, as indicated with the dashed line from the third pulse of the first sample and hold signal SHS1 358 to the eighth AD operation in AD 316. Once the eighth AD operation in AD 316 is complete, the first sample and hold signal SHS1 358 and the first row select row signal RS_ROW1 362 are turned off.

Figure 4A:
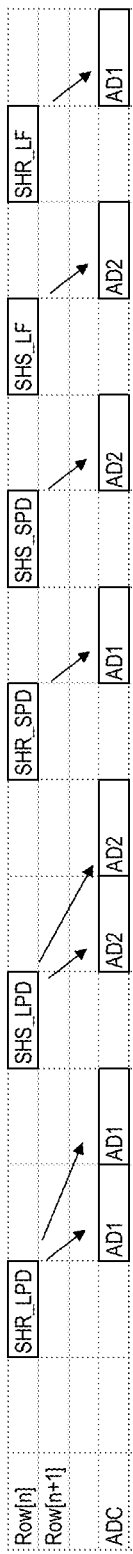
FIG. 4A is a timing diagram illustrating operations performed in an example shared pixel cell of a CMOS image sensor during readout without example sample and hold circuitry enabling parallel operations.
Figure 4B:
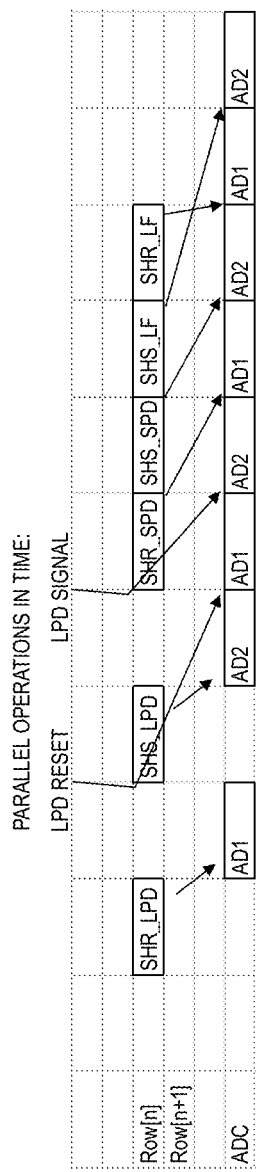
FIG. 4B is a timing diagram illustrating operations performed in an example shared pixel cell of a CMOS image sensor during a high speed readout with example sample and hold circuitry enabling parallel operations in accordance with the teachings of the present invention.

FIGS. 4A-4B are timing diagrams comparing operations performed in an example shared pixel cell of a CMOS image sensor during readout without and with example bypass and sample and hold circuitry, which enable parallel operations in accordance with the teachings of the present invention.

To illustrate, FIG. 4A shows that for a pixel cell from Row[n], a sample and hold of a reset image charge value from an LPD is performed (SHR_LPD). Next, a first AD operation of the reset image charge value from the LPD is performed at a first gain setting, and then a second AD operation of the reset image charge value from the LPD is performed at a second gain setting.

Next, a sample and hold of a signal image charge value from the LPD is performed (SHS_LPD). Next, a third AD operation of the signal image charge value from the LPD is performed at the first gain setting, and then a fourth AD operation of the signal image charge value from the LPD is performed at the second gain setting.

Next, a sample and hold of a reset image charge value from an SPD is performed (SHR_SPD). Next, a fifth AD operation of the reset image charge value from the SPD is performed.

Next, a sample and hold of a signal image charge value from the SPD is performed (SHS_SPD). Next, a sixth AD operation of the signal image charge value from the SPD is performed.

Next, a sample and hold of a signal image charge value from a LOFIC is performed (SHS_LF). Next, a seventh AD operation of the signal image charge value from the LOFIC is performed.

Next, a sample and hold of a reset image charge value from a LOFIC is performed (SHR_LF). Next, an eighth AD operation of the reset image charge value from the LOFIC is performed.

As can be appreciated, without the sample and hold circuitry in accordance with the teachings of the present invention, none of the sample and hold and analog to digital conversion operations can be performed in parallel as shown in FIG. 4A.

Referring now to FIG. 4B, which refers to an example with sample and hold circuitry in accordance with the teachings of the present invention, for a pixel cell from Row[n], a sample and hold of a reset image charge value from an LPD is performed (SHR_LPD). Next, a first AD operation of the reset image charge value from the LPD is performed at a first gain setting. As described in the examples above in FIGS. 2A-2B and FIGS. 3A-3D, with the bypass mode enabled (e.g., SW=0), the first AD operation of the reset image charge value from the LPD may be performed by the ADC 294 independent of the sample and hold circuitry 214A and 214B with the bypass provided by bypass switch 278.

Next, a sample and hold of a signal image charge value from the LPD is performed (SHS_LPD). Next, a second AD operation of the signal image charge value from the LPD is performed at the first gain setting. As described in the examples above in FIGS. 2A-2B and FIGS. 3A-3D, with the bypass mode enabled (e.g., SW=0), the second AD operation of the signal image charge value from the LPD may be performed by the ADC 294 independent of the sample and hold circuitry 214A and 214B with the bypass provided by bypass switch 278.

Next, a sample and hold of a reset image charge value from an SPD is performed (SHR_SPD). At the same time, a third AD operation is performed in parallel on the previously sampled and held reset image charge value from the LPD at a second gain setting.

Next, a sample and hold of a signal image charge value from an SPD is performed (SHS_SPD). At the same time, a fourth AD operation is performed in parallel on the previously sampled and held signal image charge value from the LPD at the second gain setting.

Next, a sample and hold of a signal image charge value from a LOFIC is performed (SHS_LF). At the same time, a fifth AD operation is performed in parallel on the previously sampled and held reset image charge value from the SPD.

Next, a sample and hold of a reset image charge value from a LOFIC is performed (SHR_LF). At the same time, a sixth AD operation is performed in parallel on the previously sampled and held signal image charge value from the SPD.

Next, a seventh AD operation is performed on the previously sampled and held signal image charge value from the LOFIC.

Next, an eighth AD operation is performed on the previously sampled and held reset image charge value from the LOFIC.

As can be appreciated in the comparisons of the timelines of FIGS. 4A-4B, with the parallel operations made possible with the bypass and sample hold circuitry at shown in FIG. 4B, the total time required to read out and perform the analog to digital conversions of the LPD, SPD, and LOFIC image charge values is reduced or improved in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A readout circuit for use in an image sensor, comprising:
    a first sample and hold (SH) circuit coupled to a bitline coupled to a pixel array;
    a second SH circuit coupled to the bitline;
    a bypass switch coupled to the bitline, the first SH circuit, and the second SH circuit; and
    an analog to digital converter (ADC) coupled to the bypass switch, wherein the bypass switch is configured to provide an image charge value from the pixel array to the ADC through the bitline, or through one of the first SH circuit or the second SH circuit in response to a switch select signal.

2. The readout circuit of claim 1, wherein each of the first and second SH circuits comprises:
    an enable transistor coupled to the bitline;
    a first storage transistor coupled to the enable transistor;
    a first storage device coupled to the first storage transistor;
    a reset transistor coupled between a supply voltage and the first storage transistor;
    a source follower transistor having a gate coupled to the first storage transistor; and
    a select transistor coupled between the source follower transistor and the bypass switch.

3. The readout circuit of claim 2, wherein each of the first and second SH circuits further comprises:
    a second storage transistor coupled to the enable transistor; and
    a second storage device coupled to the first storage transistor.

4. The readout circuit of claim 2, wherein the readout circuit further comprises a sample and hold current source coupled to the select transistor of the first SH circuit, the select circuit of the second SH circuit, and the bypass switch.

5. The readout circuit of claim 2, wherein the ADC comprises:
    a comparator having:
        a first input capacitively coupled to bypass switch to receive the image charge value from the pixel array through the bitline, or one of the first SH circuit or second SH circuit in response to the switch select signal; and
        a second input capacitively coupled to receive a ramp signal; and
    a counter coupled to an output of the comparator.

6. The readout circuit of claim 5, wherein the ADC further comprises:
    a first auto-zero switch coupled between the first input of the comparator and the output of the comparator;
    a second auto-zero switch coupled between the second input of the comparator and the output of the comparator; and
    a buffer coupled between the output of the comparator and the counter.

7. The readout circuit of claim 3, wherein the bypass switch is configured to couple the ADC to the bitline during a bypass period in response to the switch select signal,
    wherein the ADC is configured to perform a first analog to digital (AD) operation at a first gain on a reset image charge value of a large photodiode (LPD) from the bitline and then perform a second AD operation at the first gain on a signal image charge value of the LPD from the bitline during the bypass period,
    wherein the first SH circuit is configured to sample and hold the reset image charge value of the LPD from the bitline in the first storage device of the first SH circuit and then sample and hold the signal image charge value of the LPD from the bitline in the second storage device of the first SH circuit during the bypass period.

8. The readout circuit of claim 7, wherein the bypass switch is configured to couple the ADC to the first and second SH circuit during a non-bypass period in response to the switch select signal.

9. The readout circuit of claim 8,
    wherein the ADC is configured to perform a third AD operation at a second gain on the reset image charge value of the LPD stored in the first storage device of the first SH circuit and then perform a fourth AD operation at the second gain on the signal image charge value of the LPD stored in the second storage device of the first SH circuit during the non-bypass period, wherein the second SH circuit is configured to sample and hold a reset image charge value of a small photodiode (SPD) from the bitline in the first storage device of the second SH circuit during the third AD operation and then sample and hold a signal image charge value of the SPD from the bitline in the second storage device of the second SH circuit during the fourth AD operation.

10. The readout circuit of claim 9, wherein the ADC is configured to perform a fifth AD operation on the reset image charge value of the SPD stored in the first storage device of the second SH circuit and then perform a sixth AD operation on the signal image charge value of the SPD stored in the second storage device of the second SH circuit during the non-bypass period, wherein the first SH circuit is configured to sample and hold a signal image charge value of a lateral overflow integration capacitor (LOFIC) from the bitline in the second storage device of the first SH circuit during the fifth AD operation and then sample and hold a reset image charge value of the LOFIC from the bitline in the first storage device of the first SH circuit during the sixth AD operation.

11. The readout circuit of claim 10, wherein the ADC is configured to perform a seventh AD operation on the reset image charge value of the LOFIC stored in the first storage device of the first SH circuit and then perform an eighth AD operation on the signal image charge value of the LOFIC stored in the second storage device of the first SH circuit during the non-bypass period.

12. An imaging system, comprising:

a pixel array including a plurality of pixel cells arranged in rows and columns, wherein each one of the pixel cells is coupled to generate image charge in response to incident light;

a control circuitry coupled to the pixel array to control operation of the pixel array; and a readout circuit coupled to the pixel array to read out the image charge from the pixel array, wherein the readout circuit includes:

a first sample and hold (SH) circuit coupled to a bitline coupled to the pixel array;

a second SH circuit coupled to the bitline;

a bypass switch coupled to the bitline, the first SH circuit, and the second SH circuit; and an analog to digital converter (ADC) coupled to the bypass switch, wherein the bypass switch is configured to provide an image charge value from the pixel array to the ADC through the bitline, or through one of the first SH circuit or the second SH circuit in response to a switch select signal.

13. The imaging system of claim 12, further comprising function logic coupled to the readout circuit to store digital representations of the image charge values from the pixel array.

14. The imaging system of claim 12, wherein each of the first and second SH circuits comprises:

an enable transistor coupled to the bitline;

a first storage transistor coupled to the enable transistor;

a first storage device coupled to the first storage transistor;

a reset transistor coupled between a supply voltage and the first storage transistor;

a source follower transistor having a gate coupled to the first storage transistor; and a select transistor coupled between the source follower transistor and the bypass switch.

15. The imaging system of claim 14, wherein each of the first and second SH circuits further comprises:

a second storage transistor coupled to the enable transistor; and a second storage device coupled to the first storage transistor.

16. The imaging system of claim 14, wherein the readout circuit further comprises a sample and hold current source coupled to the select transistor of the first SH circuit, the select circuit of the second SH circuit, and the bypass switch.

17. The imaging system of claim 14, wherein the ADC comprises:

a comparator having:

a first input capacitively coupled to bypass switch to receive the image charge value from the pixel array through the bitline, or one of the first SH circuit or second SH circuit in response to the switch select signal; and second input capacitively coupled to receive a ramp signal; and a counter coupled to an output of the comparator.

18. The imaging system of claim 17, wherein the ADC further comprises:

a first auto-zero switch coupled between the first input of the comparator and the output of the comparator;

a second auto-zero switch coupled between the second input of the comparator and the output of the comparator; and a buffer coupled between the output of the comparator and the counter.

19. The imaging system of claim 15, wherein the bypass switch is configured to couple the ADC to the bitline during a bypass period in response to the switch select signal, wherein the ADC is configured to perform a first analog to digital (AD) operation at a first gain on a reset image charge value of a large photodiode (LPD) from the bitline and then perform a second AD operation at the first gain on a signal image charge value of the LPD from the bitline during the bypass period, wherein the first SH circuit is configured to sample and hold the reset image charge value of the LPD from the bitline in the first storage device of the first SH circuit and then sample and hold the signal image charge value of the LPD from the bitline in the second storage device of the first SH circuit during the bypass period.

20. The imaging system of claim 19, wherein the bypass switch is configured to couple the ADC to the first and second SH circuit during a non-bypass period in response to the switch select signal.

21. The imaging system of claim 20, wherein the ADC is configured to perform a third AD operation at a second gain on the reset image charge value of the LPD stored in the first storage device of the first SH circuit and then perform a fourth AD operation at the second gain on the signal image charge value of the LPD stored in the second storage device of the first SH circuit during the non-bypass period, wherein the second SH circuit is configured to sample and hold a reset image charge value of a small photodiode (SPD) from the bitline in the first storage device of the second SH circuit during the third AD operation and then sample and hold a signal image charge value of the SPD from the bitline in the second storage device of the second SH circuit during the fourth AD operation.

22. The imaging system of claim 21,
wherein the ADC is configured to perform a fifth AD operation on the reset image charge value of the SPD stored in the first storage device of the second SH circuit and then perform a sixth AD operation on the signal image charge value of the SPD stored in the second storage device of the second SH circuit during the non-bypass period,
wherein the first SH circuit is configured to sample and hold a signal image charge value of a lateral overflow integration capacitor (LOFIC) from the bitline in the second storage device of the first SH circuit during the fifth AD operation and then sample and hold a reset image charge value of the LOFIC from the bitline in the first storage device of the first SH circuit during the sixth AD operation.

23. The imaging system of claim 22,
wherein the ADC is configured to perform a seventh AD operation on the reset image charge value of the LOFIC stored in the first storage device of the first SH circuit and then perform an eighth AD operation on the signal image charge value of the LOFIC stored in the second storage device of the first SH circuit during the non-bypass period.

24. The imaging system of claim 12, wherein each one of the pixel cells comprises:
a plurality of subpixels, wherein each one of the plurality of subpixels includes a photodiode configured to photogenerate the image charge in response to incident light, wherein the plurality of subpixels includes a first subpixel and a plurality of second subpixels;
a floating diffusion coupled to receive the image charge from the plurality of subpixels;
a plurality of transfer transistors including a first transfer transistor and a plurality of second transistors, wherein the image charge is coupled to be transferred from the first subpixel to the floating diffusion through first transfer transistor, wherein the image charge is coupled to be transferred from the plurality of second subpixels to the floating diffusion through the plurality of second transfer transistors;
a neutral density filter covering over the first subpixel, wherein the first subpixel is optically coupled to receive the incident light through the neutral density filter, wherein the plurality of second subpixels is not covered by the neutral density filter;
a dual floating diffusion (DFD) transistor coupled to the floating diffusion; and
a lateral overflow integration capacitor (LOFIC) coupled to the DFD transistor.

25. The imaging system of claim 24, wherein each one of the pixel cells further comprises:
a source follower transistor coupled to a supply voltage and having a gate coupled to the floating diffusion; and
a select transistor coupled to the source follower transistor and the bitline, wherein the source follower transistor is coupled to output the image charge value to the bitline in response to the image charge in the floating diffusion.

26. The imaging system of claim 25, wherein each one of the pixel cells further comprises a reset transistor coupled between the supply voltage and the floating diffusion.

27. The imaging system of claim 24, wherein each one of the pixel cells further comprises a LOFIC transistor coupled between the LOFIC and the first subpixel.

28. The imaging system of claim 24,
wherein the first subpixel is representative of a small photodiode (SPD),
wherein the plurality of second subpixels is representative of a large photodiode (LPD).

* * * * *